United States Patent [19]

D'Amato

[11] Patent Number: 4,964,365
[45] Date of Patent: Oct. 23, 1990

[54] IMMERSION PROCESS MACHINE

[75] Inventor: Mark D'Amato, Montreal, Canada

[73] Assignee: D.E.M. Controls of Canada, Montreal, Canada

[21] Appl. No.: 357,974

[22] Filed: May 26, 1989

Related U.S. Application Data

[63] Continuation-in-part of Ser. No. 267,044, Nov. 3, 1988, Pat. No. 4,895,099.

[51] Int. Cl.$^5$ ............................................. B05C 3/12
[52] U.S. Cl. ................................. 118/419; 118/423; 118/426; 118/427; 118/429; 118/602
[58] Field of Search ................ 427/443.1, 98, 304; 118/404, 405, 419, 423, 426, 427, 429, 602; 134/122 R, 122 P

[56] References Cited

U.S. PATENT DOCUMENTS

| | | | |
|---|---|---|---|
| 778,613 | 12/1904 | Ward | 414/29 |
| 895,621 | 8/1908 | Fawell | 198/791 |
| 949,504 | 2/1910 | Sexton | 403/26 |
| 2,031,054 | 2/1936 | McCarthy | 198/204 |
| 2,135,838 | 1/1936 | Paxton | 198/127 |
| 2,718,296 | 9/1955 | Johnson | 198/264 |
| 2,748,919 | 6/1956 | Britton et al. | 198/127 |
| 2,921,670 | 1/1960 | Albers | 198/213 |
| 3,042,185 | 7/1962 | Welch | 198/160 |
| 3,082,774 | 3/1963 | Benton et al. | 134/63 |
| 3,313,199 | 4/1967 | Houvener et al. | 85/66 |
| 3,416,638 | 12/1968 | Buck | 193/37 |
| 3,440,900 | 4/1969 | Neal | 37/6 |
| 3,457,234 | 7/1969 | Gianatsio | 260/75 |
| 3,667,589 | 6/1972 | Constable | 198/127 |
| 4,015,706 | 4/1977 | Goffredo et al. | 198/780 |
| 4,563,974 | 1/1986 | Price | 118/404 |
| 4,608,941 | 9/1986 | Morris | 118/404 |
| 4,724,856 | 2/1988 | Pender | 134/122 |

FOREIGN PATENT DOCUMENTS

| | | | |
|---|---|---|---|
| 1280994 | 11/1961 | France | |
| 40082 | 11/1971 | Japan | 118/429 |

OTHER PUBLICATIONS

File Wrapper for U.S. Patent Application Ser. No. 433,482 to D. L. Goffredo and Conrad D. Shakley filed 1/15/74.
General Processing Guide for TINBOND TM 600, E. I. Du Pont de Nemours Corps. Wilmington, Del.
File Wrapper for U.S. Patent Application Ser. No. 198,622 to D. L. Goffredo and Conrad D. Shakley filed 11/15/71.

Primary Examiner—Bernard Nozick
Attorney, Agent, or Firm—Stetina and Brunda

[57] ABSTRACT

An apparatus for immersing circuit boards in a liquid. The apparatus of the invention generally comprises (a) a conveyor for moving circuit boards along a predetermined path and (b) an immersion pan positionable about at least a portion of said conveyor and operative to hold a quantity of liquid therein such that circuit boards passing along the conveyor will become immersed in said liquid. The conveyor portion of the apparatus may comprise a "roller conveyor" having a series of vertically opposed roller pairs. The immersion pan portion of the apparatus will preferably fit beneath the conveyor and will be provided with an infusion of liquid such that liquid will rise within the pan, thereby submerging at least a portion of the conveyor. Circuit boards moving along the conveyor path will thus become immersed in and pass through the liquid. The liquid may be allowed to cascade over one or more edges of the immersion pan. Cascading or over-running liquid will be collected in an underlying sump and recirculated into the immersion pan. Such recirculation is effected in a manner that provides for complete turnover of solution within the pan, avoiding dead zones or stagnant areas of solution therewithin.

13 Claims, 4 Drawing Sheets

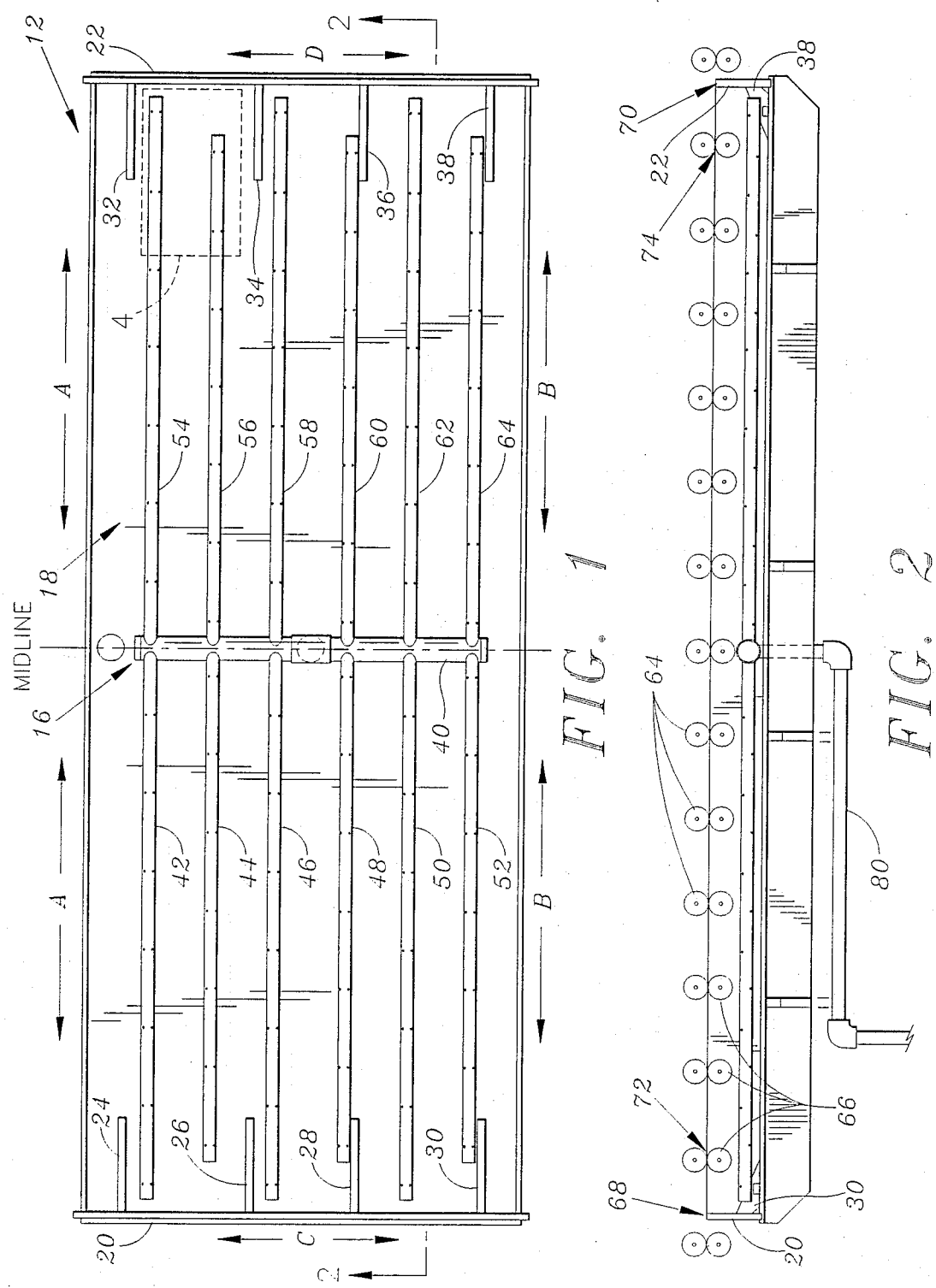

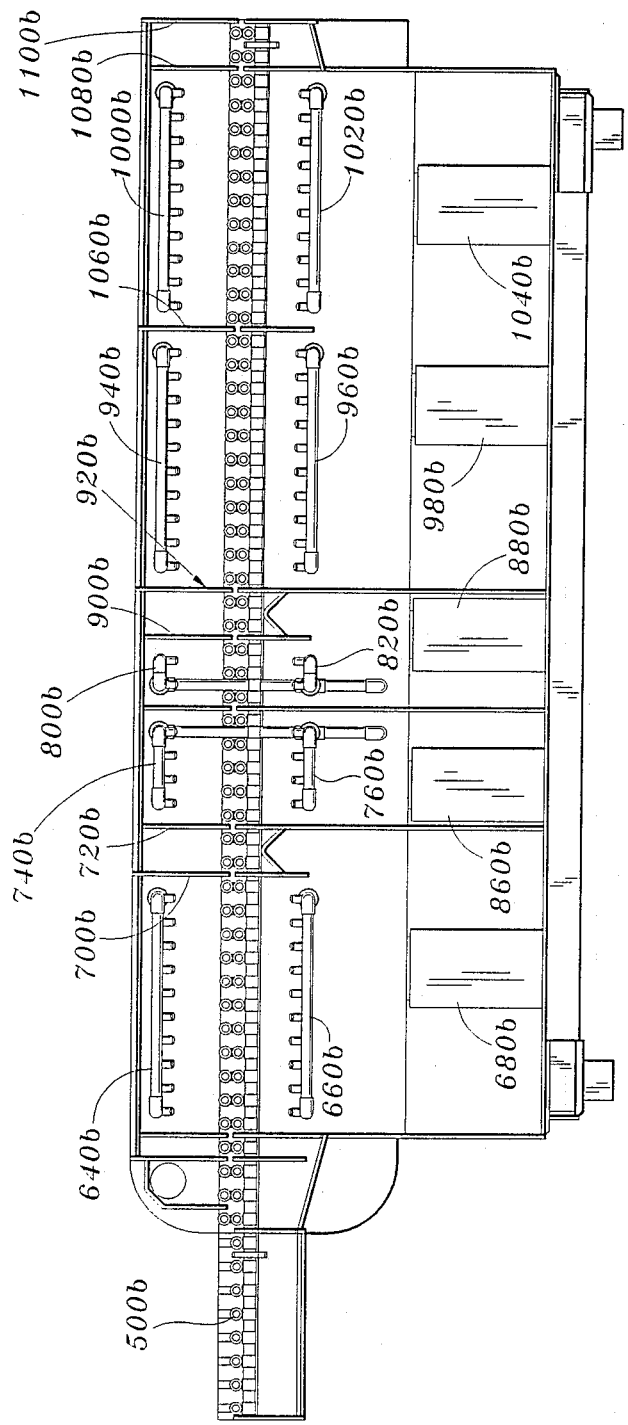

IMMERSION PROCESS MACHINE

RELATED INVENTIONS

The subject application is a continuation-in-part of U.S. patent application Ser. No. 267,044, filed on Nov. 3, 1988 now U.S. Pat. No. 4,895,099, entitled METHOD AND DEVICE FOR SEQUENTIAL SPRAY APPLICATION OF CHEMICAL SOLUTIONS USED IN THE PREPARATION OF CIRCUIT BOARD INNER LAYERS, which application is presently pending before the United States Patent and Trademark Office.

INCORPORATION BY REFERENCE

The entire disclosure of U.S. patent application Ser. No. 267,044, filed Nov. 3, 1988 now U.S. Pat. No. 4,985,099, is incorporated herein by reference.

BACKGROUND OF THE INVENTION

The present invention relates generally to the art of chemical processing and more particularly to a device for immersing printed circuit boards and/or similar items in various liquids.

During manufacture of printed circuit boards it is common practice to utilize various liquid chemical treatments and/or water rinses. Many of the liquid chemical treatments employed are for the purpose of preparing the surfaces of circuit board inner layers and/or other components for subsequent manufacturing processes and procedures. In some liquid treatments, it is desirable to apply the liquid by spray methodology while in other instances it is desirable to immerse or submerge the circuit board in the liquid for a period of time.

One particular process wherein spray methodology had been used exclusively for the application of liquid chemical solutions and water rinses is the "Method and Device for Sequential Spray Application of Chemical Solutions Used in the Manufacture of Circuit Board Inner Layers" described in U.S. patent application Ser. No. 267,044. Specifically, the method described in Application Ser. No. 267,044 involves subjecting circuit board inner layers to sequential application of four (4) chemical treatment solutions, with intermittent water rinses. The method and device of Ser. No. 267,044 is particularly useful in carrying out treatment of circuit board inner layers using the Durabond ™ preparation process (i.e. duPont de Nemours Corp., Wilmington, Del.). In accordance with the Durabond ™ process the following chemical treatment solutions are sequentially applied to circuit board inner layers:

1. Alkaline cleaner solution (Versaclean ™ 415)
2. Etching solution (SureEtch ™ 600S)
3. Tin solution (Durabond ™ 600 A/B)
4. Post-treatment solution (Durabond ™ 600 PD)

In accordance with the method and device of Ser. No. 267,044 each of the above-listed chemical treatment solutions are spray applied. However, it has been determined that the speed and efficiency of the Durabond ™ process and the reliability of the resultant multilayer circuit boards may be substantially improved if the tin solution (Durabond ™ 600 A/B) is applied by immersion technology, rather than spraying. Thus, there exists a present need in the art for a method and device for modifying that disclosed in Patent Application Ser. No. 264,044 so as to selectively apply the tin solution (third step in the process) by immersion technology, while continuing to apply the alkaline cleaner, etching solution and post-treatment solutions (first, second and fourth steps, respectively) by spray methodology as described in U.S. patent application Ser. No. 267,044.

There also exists a need in the art for improved, independent, immersion process machine which is adaptable for use in various manufacturing processes separate and apart from the method and device of U.S. patent application Ser. No. 267,044.

SUMMARY OF THE INVENTION

The present invention comprises an immersion process machine whereby circuit boards, or portions thereof, may be immersed in a liquid as they pass along a roller conveyor. The immersion process machine of the present invention may be used in conjunction with various liquid chemical treatments and/or water rinses used in the manufacture of circuit boards. In one particular application, the immersion process machine of the present invention may take the form of a retrofit apparatus to be applied to the Durabond ™ A/B portion of the device for sequentially applying chemical treatment solutions used in the Manufacture of Circuit Board Inner Layers of Patent Application Ser. No. 267,044 for purposes of converting that portion of the device to effect application of the tin solution by way of immersion rather than spraying.

In general, the immersion process machine of the present invention comprises (a) a conveyor for moving circuit boards, or portions thereof, along a predetermined path and (b) an immersion pan positionable about at least a portion of said conveyor and operative to immerse circuit boards in said liquid as they pass along the conveyor path.

The conveyor portion of the immersion process machine may comprise a series of vertically opposed roller pairs. Each roller pair may comprise a generally cylindrical upper roller and a generally cylindrical lower roller. The upper roller and lower roller of each roller pair are positioned such that in their "resting state" they will remain close spaced and/or directly abutting one another. However, at least one of the upper and/or lower rollers of each pair may be adapted to float in at least one vertical direction. Such vertical float of the upper and/or lower roller(s) will permit such rollers to separate slightly upon passage of a circuit board therebetween.

The immersion pan portion of the immersion process machine may comprise a flat, generally rectangular floor panel having longitudinal end panels extending upwardly therefrom. Side panels may be affixed to and extend vertically upward from the lateral side edges of the floor panel or, the pan may be fitted and/or affixed to existing side-wall-like structures to obviate the need for independent side walls formed as part of the pan.

It is preferable that the top edges of the immersion pan end panels extend no higher than the top edges) of the bottom rollers of adjacent conveyor roller pairs. Such will permit circuit boards advancing along the conveyor path to pass along the conveyor (i.e. between each upper-lower roller pair) without being obstructed by the end panels of the immersion pan. Thus, the circuit boards will be allowed to pass horizontally along a relatively flat conveyor path without the need for vertical deviation of the conveyor path to permit the circuit boards to pass over the top edges of such end panels.

The desired liquid may be continually pumped into the interior of the immersion pan by way of a network of pipes or a "solution supply tree" positioned within the interior of the pan. It is preferable that such solution supply tree be disposed above the floor of the pan but beneath the conveyor path. Many solution supply tree designs are contemplated by the invention, however, a preferred soution supply tree comprises (a) a primary pipe member disposed horizontally, across the longitudinal midline of the pan and (b) a plurality of secondary pipe members fluidly connected to and extending in either longitudinal direction from said primary pipe member. Solution supply ports or apertures are formed at various points in the secondary pipe members so as to provide continuous infusion of solution at various points throughout the interior of the immersion pan. Such infusion of solution at various points is effective to provide a continuous turnover of solution throughout the pan without appreciable dead or stagnant areas.

In operation, solution may be continually pumped through the solution supply tree at a rate which will exceed the capacity of the pan causing the solution to cascade or spill over the lateral ends and/or longitudinal side walls of the immersion pan. A sump may be positioned therebelow so as to catch the cascading spillover solution. A recirculation pump and appropriate piping may be attached to the sump so as to provide for a continuous recirculating of solution from the catch sump back through the solution supply tree and into the interior of the immersion pan.

Electrodes may be positioned or mounted at various points within the immersion pan so as to render the immersion process machine of the present invention operative to effect electrode position and/or electroplating of substances contained in the immersion pan upon workpieces passing therethrough.

Additional aspects of the present invention will be made apparent by the following detailed description and the accompanying drawings.

BRIEF DESCRIPTION OF THE DRAWINGS

FIG. 1 is a top plan view of an immersion pan/solution supply tree assembly of the present invention;

FIG. 2 is a longitudinal sectional view taken through line 2, 2' of FIG. 1 and including a longitudinal sectional view of a roller conveyor positioned in relation to the immersion pan/solution tree assembly;

FIGS. 6a and 6b are side elevational views of a "Device for Sequential Spray Application of Chemical Solutions Used in the Preparation of Circuit Board Inner Layers" of U.S. patent application Ser. No. 267,044 wherein a portion of the device has been modified to incorporate the Immersion Process Machine of the present invention.

DETAILED DESCRIPTION OF A PREFERRED EMBODIMENT

Figure 3:
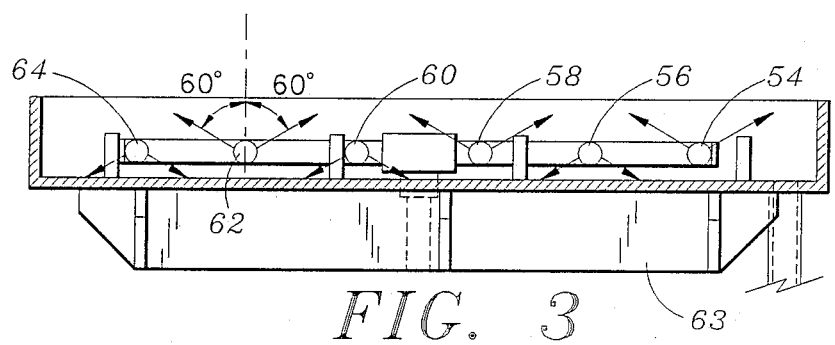
FIG. 3 is an end view of an immersion pan/solution supply tree assembly in accordance with the present invention.
Figure 4:
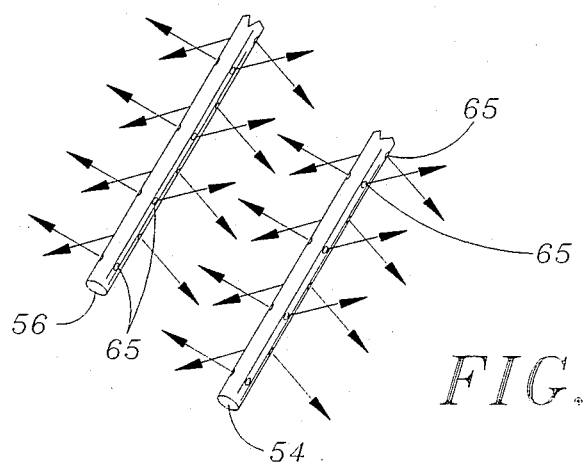
FIG. 4 is an enlarged perspective view of section 4, 4 of FIG. 1, showing the terminal portions of two secondary pipes and indicating the position and orientation of various fluid supply apertures formed therein.

The following detailed description and the accompanying drawings are provided for purposes of illustrating a presently preferred embodiment of the invention and are not intended to limit the scope of the invention in any way.

With reference to FIGS. 1-5, it will be appreciated that a preferred immersion process machine of the present invention comprises an immersion pan 12 positioned generally beneath a roller conveyor 14 and having a solution supply tree 16 positioned therein to continually provide a flow of liquid within the interior of the immersion pan 12. The liquid held within the immersion pan 12 will cause at least a portion of conveyor 14 to be surrounded by and/or submerged in such liquid so that circuit boards and/or portions thereof passing along the conveyor 14 will undergo immersion in the liquid for a desired period of time.

The immersion pan 12 comprises a generally flat rectangular floor 18 having side edges a, b and longitudinal ends c, d. End panels 20, 22 extend perpendicularly upward from longitudinal ends c and d, respectively. Gusset plates 24-38 are affixed to end panels 20, 22, and floor 18 to impart rigidity and strength.

The solution supply tree 16 is positioned on the upper surface of floor 18. Such solution supply tree 16 comprises a primary pipe member 40 and a plurality of secondary pipe members 42-64 emanating in either longitudinal direction therefrom. As shown in the enlarged view of FIG. 4, solution supply ports 65 are formed at various points in the secondary pipe members 42-64 In this preferred embodiment, the solution supply ports comprise ⅛" diameter holes formed in the walls of the secondary solution supply pipes 42-64. The solution supply ports are positioned in pairs as shown, with each ⅛" diameter hole being formed at a point approximately 60° from either the top side longitudinal midline or the bottom side longitudinal midline of each secondary pipe member.

Brace members 63 run longitudinally and transversely along the underside of the immersion pan floor 18 and serve to impart rigidity and strength to the structure of the pan 12.

As shown in FIG. 2, the immersion pan 12, having the solution supply tree 16 assembled thereon is mounted directly beneath a roller conveyor. The presently preferred roller conveyor comprises a plurality of upper rollers 64 and a plurality of lower rollers 66. The upper rollers 64 and lower rollers 66 are arranged in vertically opposed pairs comprising one upper roller 64 positioned vertically above and in direct contact with one lower roller 66.

In this preferred embodiment, each of the conveyor rollers 64, 66 comprises a rigid roller core (e.g. plastic or fiberglass reinforced plastic) having a pliable and/or elastic coating of soft PVC or similar rubber-like material (e.g. EPDM, neoprene) disposed on the outer surface thereof.

In the preferred embodiment shown, the top edges 68, 70 of end panels 20, 22 are flush with the top edges 72, 74 of the adjacent lower rollers 66. Thus, circuit boards advancing along the conveyor path may pass directly between upper 64 and lower 66 conveyor rollers and over the top edges 68, 70 of end panels 20 and 22 without the need for vertical deviation or disruption of the conveyor path to allow the circuit boards to clear the end panels.

A solution supply line 80 runs directly into the primary solution supply line 40 of solution supply tree 16. Solution supply line 80 is connected to a pump (e.g. Centrifugal Immersion Pump, D.E.M. Controls of Canada, Inc, Montreal, Quebec, Canada) which continually pumps the desired solution through the solution supply tree 16.

In the embodiment shown, the solution is pumped directly from an underlying sump, through supply line 80 and through the solution supply tree 16 at a rate which provides for continual cascading or overflow of solution over end panels 20, 22. The cascading or overflowing solution then once again collects in an underlying sump or other catch structure where it is again picked up and pumped through solution supply line 80. Thus, continual recirculation and turnover of solution within the immersion pan 12 is maintained.

i. Operation of the Preferred Embodiment

Figure 5:
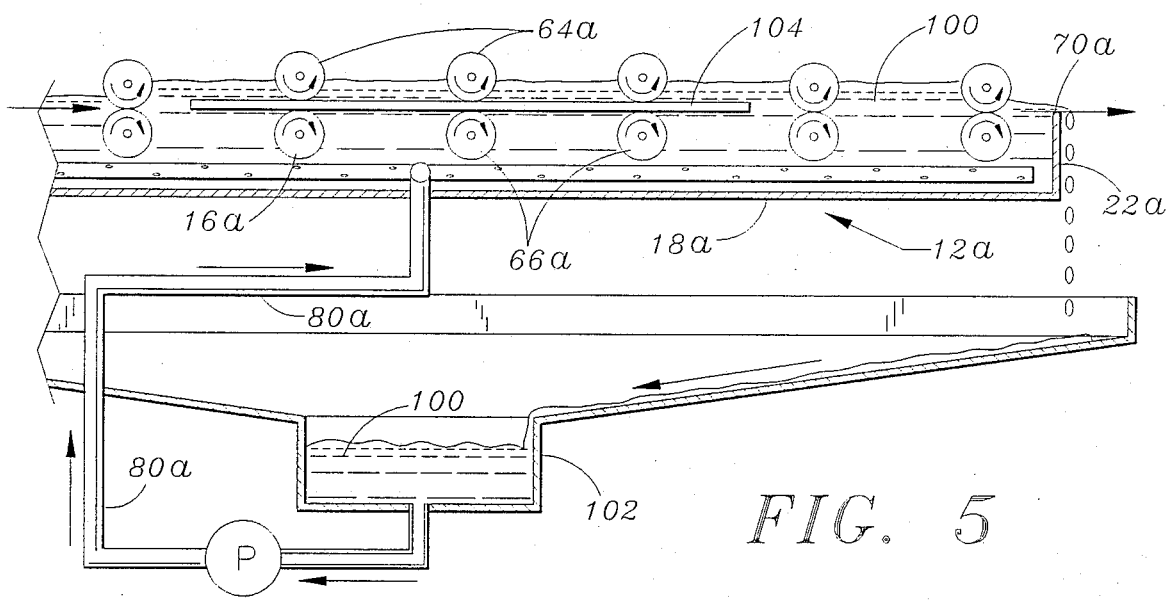
FIG. 5 is an operational schematic illustrating advancement of a circuit board through a portion of an immersion process machine in accordance with the present invention.

Referring specifically to the operational schematic of FIG. 5, it will be appreciated that a quantity of treatment solution 100 is continually recirculated within the immersion process machine of the present invention. To wit: the treatment solution 100 is pumped through solution supply line 80 by pump P through solution supply tree 16a and into the interior of the pan 12a. The longitudinal edges of the pan are affixed to sidewalls of a surrounding wall-like structure (not shown) so as to substantially contain the solution within the regions between the "resting" roller pairs as shown. In contrast, however, the end panels 22a are sized and configured so that solution 100 will continually spill or cascade over the top edges 70a of such end panels 22a. Such cascading or spilling solution will be caught within an underlying sump 102 and subsequently recirculated through solution supply line 80 by pump P. Accordingly, there is formed a continual recirculation loop whereby continuous turnover of fluid within the immersion pan may be effectuated.

The upper rollers 64a are movably mounted so as to float in a vertical up/down plane. The lower rollers 66a are rigidly mounted and are individually rotationally driven by a motor (not shown) The rotational movement of bottom rollers 66a will propel a circuit board 104 along the conveyor path, between upper roller 64a and lower roller 66a. As the circuit board 104 parts the upper roller 64a and lower roller 66a of each roller pair the upper roller 64a will float upwardly so as to permit the circuit board 104 to pass therebetween.

When the roller pairs are in their unparted or resting state they will be in direct abutment with each other. Because the outer surfaces of the rollers are covered with a relatively elastic neoprene material (e.g. Norprene ™, Norton Co.), the contact formed therebetween will form a substantially fluid-tight seal. As such, each individual roller pair, when in its unparted resting state, will act as an individual dike or dam capable of containing fluid therebetween as shown. Of course, when the upper and lower roller 64a, 66a, part to permit a circuit board 104 to pass therebetween some liquid 100 will be permitted to flow between the rollers 64a, 66a in the regions on either lateral side of the advancing circuit board 104, assuming of course that the width of the rollers 64a, 66a exceeds that of the circuit board 104.

ii. Incorporation of the Immersion Process Machine of the Present Invention into the Circuit Board Processing Line of U.S. patent Application Ser. No. 267,044.

Figure 6B:
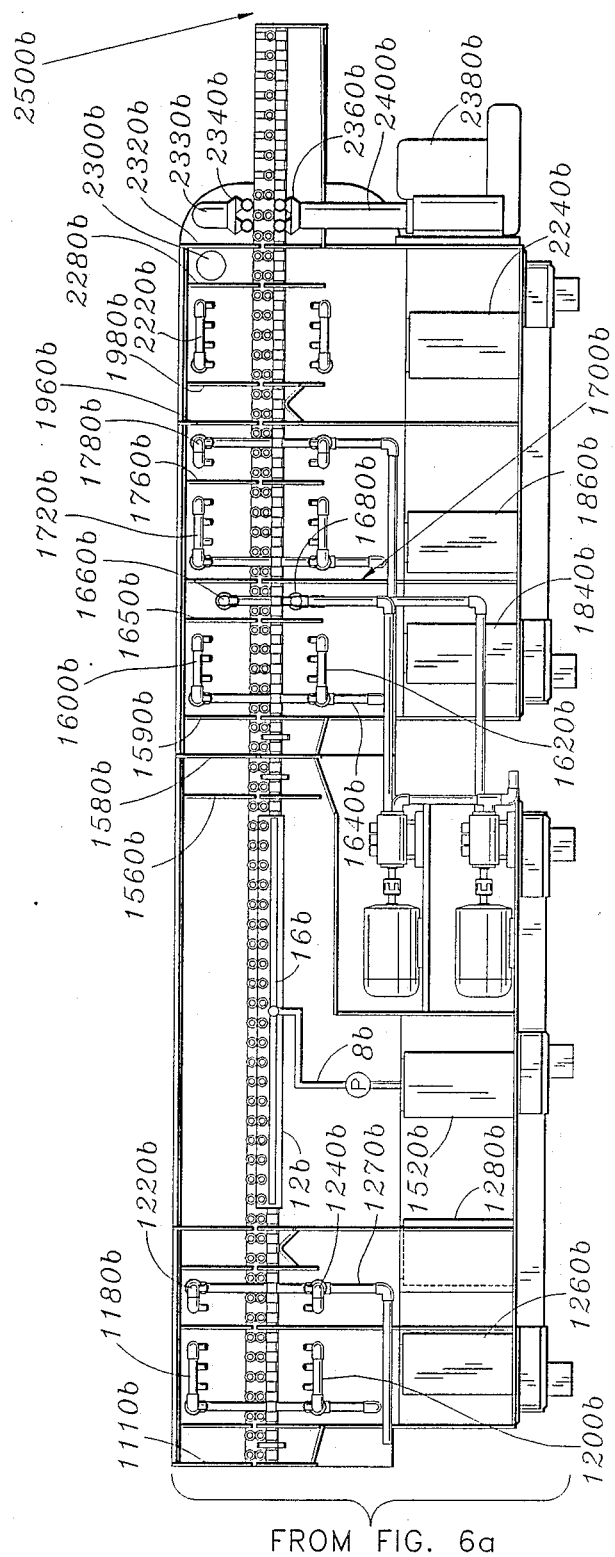

The manner in which the immersion process machine of the present invention may be incorporated into the device of U.S. patent application Ser. No. 267,044 (hereinafter the "immersion tin processing line") is shown in FIGS. 6a–6b.

The invention comprises a generally horizontal mechanical conveyor 500b running directly through three longitudinally arranged major enclosures or housings 520b, 540b, and 560b. The first major housing 520b is joined in an end-to-end fashion with the second major housing 54 by way of transitional enclosure 580b. Likewise, the second major housing 540b is joined in an end-to-end fashion with the third major housing 560b by way of transitional enclosure 600b. Thus, all chemical sprays, vapors, etc. emitted by the process are fully contained in generally air-tight enclosures. Such containment of the sprays and vapors is highly desirable in view of the known toxicity of certain commonly used treatment chemicals.

Initially, the circuit board inner layers are positioned at the input end 620b of conveyor 500b. As the inner layers advance along conveyor 500b they will enter the first major housing 52. After entering the first major housing 520b the inner layers will pass between spray manifold 640b and 660b. Generally, each of the spray manifolds incorporated into the preferred device comprise at least two longitudinal pipes with a series of individual pipe segments traversing therebetween. Such individual pipe segments will run transversely above and below the conveyor 500b. A series of individual spray nozzles or openings are provided such that pressurization of the solution within the manifold will cause a solution to be dispersed, in a generally even spray pattern, onto the surfaces of the inner layers as they pass along the conveyor 500b.

The first pair of spray manifolds 640b, 660b are fluidly connected to an alkaline cleaner sump 680b. The alkaline cleaner sump 680b is specifically sized and/or configured to hold approximately 55 gallons of alkaline cleaner solution (VersaClean ™ 415) when fully filled. A pump 650b is used to pump the alkaline cleaner solution from sump 680b to spray manifolds 640b and 660b. The alkaline cleaner solution is then continuously sprayed at about 25 psi from manifolds 640b and 660b. The alkaline cleaner spray covers a region approximately 24 inches in length. Thus, as the inner layers pass along the conveyor at a rate of 4 ft/min they will be exposed to the alkaline cleaner solution spray for about 30 seconds each. Runoff or excess alkaline cleaner solution is recollected in sump 680b so as to be continuously recirculated within the system.

After the advancing inner layers have passed through the alkaline cleaner spray they will pass through openings in partitions 700b and 720b, thus emerging into a first cascade rinse spray emanating from spray manifolds 740b, 760b, 800b, and 820b. Specifically, spray manifolds 740b and 760b are connected to a first water feed line 780b while spray manifolds 800b and 820b are connected to a second water feed line 840b. First water feed line 780b is connected to sump 860b while the second water feed line 840b is connected to sump 880b. A pump 890b is employed to circulate water from sump 880b through feed line 840b to pressurize manifolds 800b and 820b. The water sprayed from manifolds 800b and 820b strike the under layers and/or conveyor. The subsequent runoff is then recollected in sump 880b. Sump 880b is fluidly connected to neighboring sump 860b. Excess reclaimed water in sump 880b is permitted to "cascade" into sump 860b. Hence the term "cascade rinse".

Similarly, a centrifugal pump 870b circulates water from sump 860b through water feed line 780b to pressurize manifolds 740b and 760b. The resultant spray from manifolds 740b and 760b strikes the advancing inner layers and/or conveyor surfaces and is subsequently recollected in sump 860b. The reclaimed water in sump 860b is then continually recirculated and sprayed from manifolds 740b and 760b. Excess water in sump 860b escapes to drain through an overflow.

The sprays emanating from manifolds 740b, 760b, 800b, 820b cover a combined region of approximately 16–20 inches at pressures of about 20–60 psi and preferably at 26–27 psi. The inner layers passing along the conveyor at the rate of approximately 4 ft/min will be exposed to this first rinse spray for a total of about 20–30 seconds.

After the advancing inner layers have passed through the first cascade rinse, they will pass through openings in partitions 900b and 920b, thus moving into an etching solution spray (SureEtch™ 600 S) which emanates from spray manifolds 940b and 960b.

Spray manifolds 940b and 960b are fluidly connected to sump 980b. Sump 980b is specifically sized and configured to contain about 80–110 gallons and preferably 80 gallons of etching solution when fully filled. Thus, a total of approximately 160–220 gallons and preferably 160 gallons of etching solution is provided when the sumps 980b and 1040b are filled to capacity. The etching solution is circulated from sump 980b to manifolds 940b and 960b by way of a centrifugal pump 950b. Thus, the inner layers are exposed to the etching solution spray emanating from manifolds 940b and 960b as they advance along conveyor 500b. Runoff etching solution from spray manifolds 940b and 960b is recollected in sump 980b and recirculated. This etching solution spray process is then repeated by spray manifolds 1000b and 1020b which are fluidly connected to sump 1040b. Sump 1040b is also sized and configured to contain 110 gallons of etching solution when fully filled and is fluidly connected to manifolds 1000b and 1020b so that solution pumped by centrifugal pump 1010b from sump 1040b will be sprayed from manifolds 1000b and 1020b onto the advancing inner layers as they move along conveyor 500b. The runoff etching solution from manifolds 1000b and 1020b will then be recollected in sump 104 and subsequently recirculated.

Filters 1030b and 1050b are provided and are appropriately sized to remove any solid matter from the etching solution as it is recirculated and sprayed. All filters incorporated with the device of the present invention will be appropriately sized to remove potentially deleterious solid matter from the recirculation chemical solution(s).

An inner partition 1060b separates manifolds 940b, 960b from manifolds 1000b, 1020b. Thus, the etching solution spray treatment is divided between two (2) separate inner chambers Manifolds 949b, 969b, 1009b, and 1020b are each sized to provide a spray pattern approximately 48 inches in length. Thus, as the inner layers advance along conveyor 500b at a rate of 4 ft/min they will be exposed to etching solution for a total of one (1) minute (two (2) 30-second exposures).

Following exposure to the etching solution the inner layers will continue to advance along conveyor 500b, through openings in partitions 1080b, 1100b, and 1160b and into the second major housing 540b. As they move into the second major housing 540b they will pass through a second cascade rinse emanating from manifolds 1180b, 1200b, 1220b, and 1240b. Manifolds 1220b and 1240b are fluidly connected to a tapwater feed line 1260b which will provide pressurized water through spray manifolds 1220b and 1240b. After spraying, the runoff water is then recollected in sump 1280b.

Sump 1280b is fluidly attached to sump 1260b such that excess water collected in sump 1280b will cascade into sump 1260b. Sump 1260b is fluidly connected to manifolds 1180b and 1200b via water supply line 1300b Water is pumped by centrifugal pump 1270b from sump 1260b through supply line 1300b and into manifolds 1180b and 1200b where it is subsequently sprayed upon the advancing inner layers. Excess water in sump 1260b is permitted to overflow into a drain.

The water sprays emanating from manifolds 1180b, 1200b, 1220b, and 1240b are at pressures of about 20–60 psi and preferably at 26–27 psi.

After emerging from the second cascade rinse, the inner layers will pass through openings in partitions 1400b and 1420b and move into an immersion process station 2800b of the present invention. The immersion process station 2800b of the present invention is operative to immerse the advancing circuit board inner layers in a third chemical treatment solution, such as immersion tin plating solution (e.g., Durabond™ A/B).

As shown, the immersion process station 2800b comprises an immersion pan 12b positioned beneath a section of conveyor 500b. The immersion pan 12b comprises a generally flat floor panel 18b with end panels 20b and 22b extending upwardly at either longitudinal end thereof. The top edges 68b, 70b of end panels 20b, 22b terminate flush with the top edges of adjacent bottom rollers 2720b, 2740b, 2760b, and 2780b, respectively.

A solution supply tree 16b is positioned within the immersion pan 12b and is operatively connected to underlying sumps 1520b and (not shown). Each of these sumps 1520b and (not shown) is specifically sized and configured to contain a maximum of approximately 90–110 gallons and preferably about 95 gallons of immersion tin solution (Durabond™ 600 A/B) when fully filled. Thus, a total volume of approximately 180 to 220 gallons and preferably about 190 gallons of the immersion tin solution will be available when both sumps 1520b and (not shown) are filled to capacity.

Immersion tin solution initially deposited in the sumps 1520b and (not shown) is pumped through solution supply line 80b, through solution supply tree 16b and into the interior of immersion pan 12b. As the continuous supply of solution to the interior of pan 12b continues, excess solution will pour over the top edges 68b, 70b of end panels 20b and 22b. Such pour-over or cascading solution will be caught in underlying sumps 1520b and (not shown) and will be subsequently recirculated in the above-described manner.

An in-line filter 1470b may be positioned in line 80b or at any other point in the system where it will effectively remove undesirable particulate matter from the solution as it is being recirculated.

In the embodiment shown, the immersion pan 12b is approximately 48 inches in length. Thus, as the inner layers advance along a conveyor at a fixed rate of 4 ft/min, they will remain immersed in the immersion tin solution for approximately one (1) minute.

Following immersion within the immersion tin solution, the inner layers will pass through openings in partitions 1560b, 1580b, and 1600b, thus moving into the third major housing of the overall device. Upon entering the third major housing 560b, the advancing inner layers will be exposed to a novel and highly effective multi-stage rinse.

The preferred multi-stage rinse of the present invention consists of a four stage water rinse comprising (a) a first water spray emanating from manifolds 1600b and 620b; (b) a second (high pressure) water spray emanating from manifolds 1660b and 1680b; (c) a third water spray emanating from manifolds 1720b and 1740b; and (d) a fourth (fresh) water spray emanating from manifolds 1780b and 1800b. Specifically, as shown in FIG. 6b, spray manifolds 1600b and 1620b are connected to water feedline 1640b. High pressure manifolds 1660b and 1680b are connected to high pressure feedline 1700b. Spray manifolds 1720b and 1740b are connected to water feedline 1760b and fresh water manifolds 1780b and 1800b are connected to fresh water feedline 1820b.

Feedline 1640b is connected to sump 1840b while feedline 1760b is connected to sump 1860b. Fresh water is sprayed through manifolds 1780b and 1800b. Runoff from manifolds 1780b and 1800b is collected in sump 1860b. Water collected in sump 1860b is then pumped through line 1760b by pump 1770b and sprayed through manifolds 1720b and 1740b. The runoff from manifolds 1720b and 1740b is recollected in sump 1860b. Sump 1860b is arranged so as to cascade over into sump 1840b, thus excess recycled rinse water from sump 1860b will continually pass into sump 1840b. The recycled water contained in sump 1840b is pumped through feedline 1640b by pump 1650b, thereby pressurizing manifolds 1600b and 1620b. Runoff from the spray created by manifolds 1600b and 1620b is again collected and reclaimed in sump 1840b. In addition, a small amount (about 0.7 gal./min.) of fresh water is sprayed through manifolds 1660b and 1680b via high pressure pumps 1940b and 2000b. Runoff from manifolds 1660b and 1680b is also collected in sump 1840b. Excess water collection in sump 1840b is permitted to overflow through a drain.

The high pressure pumps 1940b and 2000b are of the centrifugal type while the motors 2000b and 2040b are totally enclosed fan-cooled electric motors. Fresh water enters the input ports 2100b and 2120b of pumps 1940b and 2000b, respectively, via fresh water supply line 2140b. The high pressure (e.g. 100-250 psi) output of pumps 1940b and 2000b will pass through lines 1909b, 1700b, 1960b, and 1710b, thereby providing a high pressure water supply to spray manifolds 1660b and 1680b.

By this novel arrangement of pumps, sumps, lines, and spray manifolds, this preferred device of the invention effects a four (4) stage rinse as follows:

Stage 1: Recirculated water sprayed over a region of approximately 12 inches in length at a pressure of about 26 psi. Thus, inner layers passing along the conveyor at a rate of 4 ft/min. will be exposed to this first stage spray rinse for about 15 seconds.

Stage 2: Fresh water sprayed over a region of approximately 4-8 inches in length at a pressure between 100-250 psi (preferably 100 psi). Thus, as the inner layers pass along the conveyor 500b at a rate of 4 ft/min, they will be exposed to this second stage high pressure rinse for a period of 5-10 seconds.

Stage 3: Recirculated water sprayed over a region of approximately 12 inches in length at a pressure of about 26 psi. Thus, as the inner layers pass along the conveyor 500b at a rate of 4 ft/min, they will be exposed to this third stage spray rinse for a period of about 15 seconds Stage 4: Fresh water sprayed over a region of approximately 4-8 inches in length at a pressure of about 40 psi (standard line pressure). Thus, as the inner layers advance along the conveyor 500b at a rate of 4 ft/min, they will be exposed to this fourth stage fresh water spray rinse for a period of 5-10 seconds.

The individual stages of the multi-stage fresh water rinse are separated from one another by way of partitions 1900b, 1920b, and 1940b. Thus, carryover water from one stage to the other is minimized.

After the inner layers have passed through the complete multi-stage rinse system, they will continue to advance along conveyor 500b, passing through openings in partitions 1960b and 1980b. Thereafter, the inner layers are subjected to a post-treatment solution spray emanating from manifolds 2200b and 2220b. The post-treatment spray manifolds 2200b and 2220b are fluidly connected to sump 2240b and pump 2210b is used to continually recirculate post-treatment solution from sump 1240b through spray manifolds 2200b and 2220b. Sump 2240b is sized/configured to hold approximately 60-80 gallons and preferably about 70 gallons treatment solution when filled to capacity. A filter 2230b is provided. Runoff post-treatment solution is collected in sump 2240b, thereby providing for a fully recirculating continuous spray process.

The spray pattern provided by manifolds 2200b and 2220b is sized so as to cover a region of approximately 12 inches in length and to deliver approximately 50 liters/min of post-treatment solution. Thus, as the inner layers advance along conveyor 500b at a rate of 4 ft/min, they will be exposed to such post-treatment solution spray for a period of approximately 15 seconds.

Following exposure to the post treatment solution spray, the circuit board inner layers will pass through an opening in partition 2280b, thereby moving into an evaporation chamber defined by partitions 2280b and 2320b. An exhaust duct 2300b is positioned between partitions 2280b and 2320b so as to maintain some negative pressure within the evaporaton chamber. The negative pressure created by exhaust duct 2300b will cause air to be pulled through the conveyor-accommodating openings in partitions 2280b and 2320b. As a result, forced heated air from hot air ducts 2340b and 2360b will readily pass through the opening in partition 2320b and will stike the surfaces of the inner layers as they advance along the conveyor 500b.

The four conveyor rollers (two sets) 2310b positioned between partitions 2280b and 2320b are of a specialized nature and are preferably constructed of stainless steel shafts having a chamois-like silicone-free natural fiber covering. Rubber clad stainless steel rollers may also be employed for this purpose. These specialized rollers 2310b are positioned so as to evenly distribute and remove any excess of post treatment solution from the surfaces of the inner layers as they pass therebetween. After the inner layers have passed between specialized rollers 2310b and 2330b there will remain a thin, even, and uniform layer of post-treatment solution deposited on the surfaces thereof. The negative pressure created by exhaust duct 2300b and the resultant flow of hot air through opening in partition 2320b will serve to rapidly evaporate the solvents and/or other liquid from the layers of post-treatment solution which remains on the surfaces of the inner layers.

Although the invention has been described herein with particular reference to presently preferred embodiments thereof, it will be appreciated by those skilled in the art that various additions, alterations and modifications may be made to such preferred embodiments without departing from the spirit and scope of the invention. For example, instead of forming solution output holes or apertures at points along the secondary solution supply lines of the solution supply tree 16 it is foreseeable that a plurality of nozzles may be used instead. Similarly, the secondary supply lines themselves may be made open ended so as to direct outflow of fluid from the end of each secondary supply line. Also, the conveyor 20 need not be an opposed roller type conveyor as shown. So long as roller pairs are positioned at either end to carry out the required fluid containment function, the inner portion of the conveyor may comprise any mechanical transfer means such as a rotating belt conveyor or the like. Thus, it is intended that the above enumerated any and all such additions, modifications and alterations, and others, be included within the scope of the following claims and the equivalents thereof.

What is claimed is:

1. An immersion process machine for immersing circuit boards in a liquid, said immersion process machine comprising:
   a circuit board conveyor comprising a plurality of vertically opposed roller pairs aligned along a predetermined conveyor path, each said roller pair comprising an upper roller and a lower roller positioned so that a horizontally disposed circuit board may pass therebetween;
   an immersion pan positioned adjacent a portion of said conveyor along said predetermined path, at least a portion of said conveyor extending into said pan, said pan being formed to hold at least a first quantity of said liquid, said immersion pan comprising:
      a floor panel disposed horizontally beneath said conveyor, said floor panel having first and second longitudinal ends; and
      first and second end panels attached to and extending upwardly from said floor panel;
   a liquid supply assembly associated with said immersion pan operable to infuse said liquid into said immersion pan in a manner providing a continuous turnover of said liquid throughout said immersion pan to avoid stagnant areas of liquid within said pan, said liquid supply assembly comprising at least one pipe member disposed in a substantially horizontal plane above said floor panel and beneath said conveyor, said at least one pipe member having a plurality of apertures formed therein; and
   a liquid supply line fluidly attached to said at least one pipe member and operative to infuse liquid through said at least one pipe member and into said pan at a first infusion rate.

2. The apparatus of claim 1 wherein said series of rollers comprises a plurality of roller pairs, each said roller pair comprising:
   a generally cylindrical upper roller positioned transversely across said conveyor path;
   a generally cylindrical lower roller positioned transversely across said conveyor path;
   said upper roller being positioned substantially above said lower roller; and
   said upper and lower rollers being rotatable in opposite directions to facilitate passage of a workpiece therebetween, and along said conveyor path.

3. The apparatus of claim 1 wherein at least one of the rollers of each roller pair is vertically moveable so as to render said roller pair alternately disposable in (a) a "resting" configuration wherein said upper and lower rollers are in direct contact to one another and an "operative" configuration wherein said upper and lower rollers are parted to allow passage of a horizontally disposed circuit board therebetween.

4. The apparatus of claim 1 wherein:
   said immersion pan floor panel is generally rectangular in configuration having first and second lateral side edges and first and second longitudinal ends.

5. The immersion process machine of claim 1 wherein said first and second end panels extend only so far upward as to be approximately flush with the top edges of said bottom rollers.

6. The apparatus of claim 1 wherein:
   a transverse midline is definable on said floor panel, said transverse midline extending transversely across said floor panel approximately midway between the first and second longitudinal ends thereof; and
   a primary pipe member is disposed horizontally above said transverse midline of said floor panel; and
   said plurality of secondary pipe members are independently connected to and extend perpendicularly from said primary pipe member; and
   wherein said primary pipe member is devoid of apertures and said secondary pipe members incorporate said plurality of apertures at various positions thereon, such that said liquid will flow into said immersion pan from said various positions on said secondary pipe members.

7. The apparatus of claim 6 wherein said plurality of apertures comprise $\frac{1}{8}$" i.d. holes formed in said secondary pipe members.

8. The immersion process machine of claim 1 further comprising a sump positioned beneath said immersion pan, said sump being sized and configured to catch liquid which spills out of said immersion pan.

9. The immersion process machine of claim 8 further comprising:
   a pipe fluidly connecting said sump to said at least one pipe member; and
   a pump operative to pump liquid from said sump, through said pipe, through said at least one pipe member and into said immersion pan.

10. The immersion process machine of claim 9 wherein the capacity of said sump, the capacity of said immersion pan, and the operability of said pump are such that liquid may be continually pumped from said sump, through said pipe, through said at least one pipe member and into said immersion pan such that the capacity of said immersion pan will be overcome and said liquid will overflow said pan and be subsequently caught in said sump, thereby providing a continually recirculating liquid supply system.

11. An apparatus for immersing circuit boards in a liquid, said apparatus comprising:

a conveyor for moving circuit boards along a predetermined path;

an immersion pan comprising a substantially flat floor panel positioned in a generally horizontal plane beneath said conveyor, said immersion pan being disposed about said conveyor along said predetermined path, at least a portion of said conveyor extending into said pan, said pan being formed to hold at least a first quantity of liquid therein such that said circuit boards passing along said conveyor will become immersed in said liquid;

at least one liquid supply line fluidly connected to said immersion pan;

a pump operative to pump liquid through said liquid supply line and into said immersion pan; and a liquid supply tree positioned within said immersion pan, said liquid supply tree comprising:

a primary pipe member disposed horizontally above said floor panel and beneath said conveyor, said primary pipe member fluidly connected to said liquid supply line; and a plurality of secondary pipe members disposed horizontally above said floor panel and fluidly connected to said primary pipe member;

whereby, upon passage of liquid through said liquid supply line and into said liquid supply tree, said liquid will flow through a plurality of apertures formed in said liquid supply tree and into said immersion pan.

12. The apparatus of claim 11 wherein:

said primary pipe member extends in the direction of the predetermined path; and said plurality of secondary pipe members extend in a direction perpendicular to said predetermined path;

wherein said primary pipe member is devoid of apertures and said secondary pipe members incorporate said plurality of apertures, such that said liquid will flow into said immersion pan through said apertures.

13. The apparatus of claim 12 wherein said plurality of apertures comprise ⅛ inch i.d. holes formed in said secondary pipe members.

* * * * *

UNITED STATES PATENT AND TRADEMARK OFFICE
CERTIFICATE OF CORRECTION

PATENT NO. : 4,964,365
DATED : October 23, 1990
INVENTOR(S) : Mark D'Amato

It is certified that error appears in the above—identified patent and that said Letters Patent is hereby corrected as shown below:

In Column 1, Line 18, delete "4,985,099" and insert therefore --4,895,099--.

In Column 4, Line 34, after "42-64", insert --.--

In Column 5, Line 46, after "(not shown)", insert --.--

In Column 7, Line 63, after "chambers", insert --.--

In Column 9, Line 13, delete "620b" and insert therefore --1620b--.

Signed and Sealed this

Twenty-ninth Day of September, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 4,964,365

DATED : October 23, 1990

INVENTOR(S) : Mark D'Amato

It is certified that error appears in the above-identified patent and that said Letters Patent is hereby corrected as shown below:

Column 1, line 66, delete "264,044" and insert therefore --267,044--.
Column 3, line 8, delete "soution" and insert therefore --solution--.
Column 3. line 53, delete "4,4" and insert therefore --4,4'--.
Column 6, line 43, delete "55" and insert therefore --75--.
Column 7, line 29, after "980b (1st occurrence) insert -- and 1040b--.
Column 7, line 36 after "950b" insert --and 1010b--.
Column 8, line 43, delete "sumps" and insert therefore --sump--.
Column 8, line 43, delete "and (not shown)".
Column 8, lines 43-44, delete "Each of these sumps" and insert therefore --This sump--.
Column 8, line 44, delete "and (not shown)".
Column 8, line 48, delete "180 to 220" and insert therefore --90-11--.
Column 8, line 49, delete "190" and insert therefore --95--.
Column 8, line 50, delete "both sumps" and insert therefore --the sump--.
Column 8, line 51, deleter, "and (not shown)".
column 8, line 51, delete "are" and insert therefore --is--.
Column 8, line 53, delete "sumps" and insert therefore --sump--.
Column 8, line 53, delete "and (not shown)".
Column 7, line 41, after "980b" insert --and 1040b--.

UNITED STATES PATENT AND TRADEMARK OFFICE
CERTIFICATE OF CORRECTION

PATENT NO. : 4,964,365

DATED : October 23, 1990

INVENTOR(S) : Mark D'AMATO

It is certified that error appears in the above-identified patent and that said Letters Patent is hereby corrected as shown below:

Column 8, line 59, delete "sumps" and insert therefore --sump--.
Column 8, line 60, delete " and (not shown)".
Column 10, line 29, delete "60-80" and insert therefore --40-60--.
Column 10, line 29, delete "70" and insert therefore --55--.
Column 10, line 53, delete "stike" and insert therefore --strike--.

Signed and Sealed this

Twenty-ninth Day of December, 1992

*Attest:*

DOUGLAS B. COMER

*Attesting Officer*   Acting Commissioner of Patents and Trademarks